(12) United States Patent
Ahuja et al.

(10) Patent No.: US 7,751,189 B2
(45) Date of Patent: Jul. 6, 2010

(54) COOLING ARRANGEMENT TO COOL COMPONENTS ON CIRCUIT BOARD

(75) Inventors: Sandeep Ahuja, University Place, WA (US); Ioan Sauciuc, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 53 days.

(21) Appl. No.: 11/852,158

(22) Filed: Sep. 7, 2007

(65) Prior Publication Data

US 2009/0080156 A1 Mar. 26, 2009

(51) Int. Cl.
*H05K 7/20* (2006.01)

(52) U.S. Cl. ............. 361/697; 361/679.48; 361/679.49; 361/679.5; 361/695; 165/80.3; 165/104.34

(58) Field of Classification Search .................. 361/687, 361/690–697, 719–723; 454/184; 165/80.3, 165/104.21, 104.33, 185; 174/15.1, 16.3, 174/252

See application file for complete search history.

(56) References Cited

U.S. PATENT DOCUMENTS

| | | | | |
|---|---|---|---|---|
| 3,790,859 A | * | 2/1974 | Schraeder et al. ........... 361/694 |
| 4,277,816 A | * | 7/1981 | Dunn et al. .................. 361/694 |
| 4,291,364 A | * | 9/1981 | Andros et al. ............... 361/694 |
| 4,296,455 A | * | 10/1981 | Leaycraft et al. ............ 361/691 |
| 4,489,363 A | * | 12/1984 | Goldberg ..................... 361/693 |
| 5,218,513 A | * | 6/1993 | Brown ......................... 361/689 |
| 5,495,389 A | * | 2/1996 | Dewitt et al. ........... 361/679.57 |
| 6,462,948 B1 | * | 10/2002 | Leija et al. .................. 361/697 |
| 6,654,247 B1 | * | 11/2003 | Lee ............................. 361/697 |
| 6,721,180 B2 | * | 4/2004 | Le et al. ...................... 361/695 |
| 6,822,862 B2 | * | 11/2004 | Rong-Yao .................... 361/695 |
| 6,999,312 B1 | * | 2/2006 | Garnett et al. .............. 361/687 |
| 7,079,388 B2 | * | 7/2006 | Faneuf et al. ................ 361/687 |
| 7,361,081 B2 | * | 4/2008 | Beitelmal et al. ........... 454/184 |

* cited by examiner

*Primary Examiner*—Michael V Datskovskiy
(74) *Attorney, Agent, or Firm*—Blakely, Sokoloff, Taylor & Zafman LLP

(57) ABSTRACT

A circuit board including a blower thereon to cool a heat generating arrangement. The circuit board includes a board substrate; a blower disposed on the board substrate, the blower having an inlet adapted to take in coolant in a inlet direction, and an outlet adapted to blow out coolant in a first outlet direction extending at an angle with respect to the inlet direction; and a heat-generating arrangement disposed on the board substrate such that the blower is adapted to blow out coolant in the first outlet direction to cool the heat generating arrangement.

13 Claims, 3 Drawing Sheets

COOLING ARRANGEMENT TO COOL COMPONENTS ON CIRCUIT BOARD

FIELD

Embodiments of the present invention relate generally to the field of microelectronic fabrication, and, in particular to a method of cooling components disposed on a motherboard or circuit board.

BACKGROUND

Typically, components on a circuit board, such as microprocessors including CPU's and memory modules, or such as other integrated circuits typically found on a circuit board, including chipsets, graphics cards, along with hard drives generate heat. The heat generated by such components must be dissipated in order to ensure proper functioning of the components. Typically, heat sinks are used on these components to increase the surface area available for heat dissipation. Sometimes, the heat sinks are coupled with fans to speed up heat exchange.

In the case of multi-core server CPU's, a typical core region on a circuit board may be about 12 inches wide and about 7 inches long. As seen in FIG. 1, a portion of a typical motherboard or circuit board 100 is shown including a board substrate 102. The shown portion may include other components thereon, such as, for example, sockets 104. The shown portion further includes a multi-core server CPU region 105, which constitutes a heat generating arrangement 106 including a first CPU 108, a second CPU 110, and memory modules in the form of a first DRAM 112 and a second DRAM 114. Typically, the prior art places a heat sink, such as, in the shown example, a first heat sink 116 at a first half of the heat generating arrangement 106, and a second heat sink 118 at a second half of the heat generating arrangement 106. The heat sinks are shown in broken lines, and the border therebetween is also shown by way of broken lines in bold-face. Each heat sink 116/118 takes up about one half of the top surface of the heat generating arrangement 106, the heat sinks 116 and 118 being disposed in series with respect to one another (i.e.: an outlet of heat sink 116 corresponds to an inlet of heat sink 118). The portion of the circuit board 100 also includes an axial fan, such as axial rotary fan 120 disposed at an inlet of heat sink 116 and adapted to draw air therein, and to blow air into the heat sinks 116 and 118 to cool the heat generating arrangement 106 including the shown multi-core server CPU.

As can be seen from FIG. 1, CPU 110 is disadvantageously subjected to significant pre-heating of its coolant air from DRAM 114 disposed at an upstream region thereof. In other words, by the time the coolant air flowing first in heat sink 116 reaches heat sink 118 disposed on CPU 110, it is already significantly heated by the DRAM 114, such as for example by about 10 degrees Celsius. As components sizes decrease, the configuration in FIG. 1 would be ineffective for ensuring adequate heat removal from the heat generating arrangement.

In addition, as silicon integration continues, DRAMS may be integrated into CPU's. In such a case, a length dimension L of the heat sinks 116 and 118 may be cut by about a half, although their widths may remain substantially unchanged, while the heat generated per surface area of the CPU's would increase at least as a result of the DRAM integration. In such a case, the cooling system shown in FIG. 1, including the axial fan 120 and heat sinks 116 and 118 disposed in series would be far from adequate in dissipating the heat from the CPU's and integrated DRAMs.

The prior art fails to provide a cooling arrangement for cooling heat generating arrangements on a circuit board, such as heat generating arrangements including CPU's and DRAM's of decreasing sizes, and such as heat generating arrangements including CPU's having DRAM's or other memory modules integrated therein.

BRIEF DESCRIPTION OF THE DRAWINGS

FIG. 2b is a top plan view of the portion of the circuit board of FIG. 2a;

Figure 1:
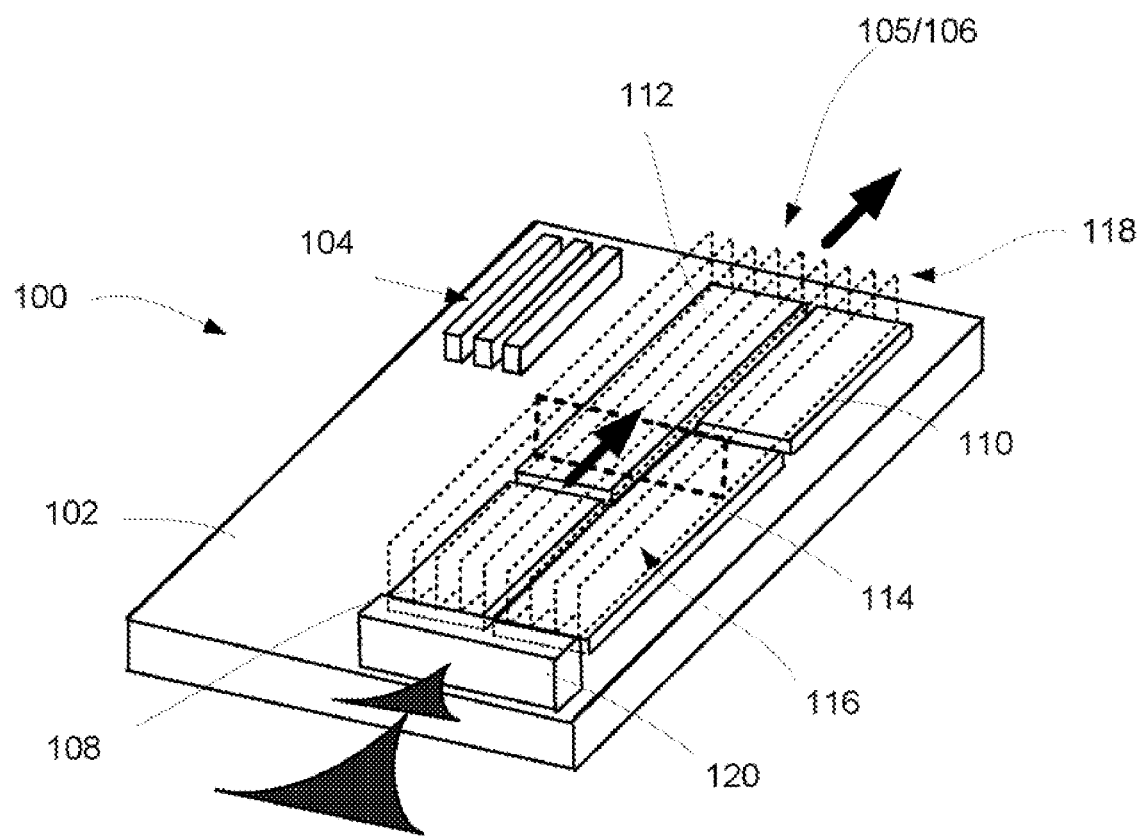
FIG. 1 is a perspective view of a portion of a circuit board including a multi-core server CPU heat generating arrangement being cooled by a cooling system according to the prior art.

For simplicity and clarity of illustration, elements in the drawings have not necessarily been drawn to scale. For example, the dimensions of some of the elements may be exaggerated relative to other elements for clarity. Where considered appropriate, reference numerals have been repeated among the drawings to indicate corresponding or analogous elements.

DETAILED DESCRIPTION

In the following detailed description, a circuit board including a cooling arrangement thereon, and a system including the circuit board are disclosed. Reference is made to the accompanying drawings within which are shown, by way of illustration, specific embodiments by which the present invention may be practiced. It is to be understood that other embodiments may exist and that other structural changes may be made without departing from the scope and spirit of the present invention.

The terms on, above, below, and adjacent as used herein refer to the position of one element relative to other elements. As such, a first element disposed on, above, or below a second element may be directly in contact with the second element or it may include one or more intervening elements. In addition, a first element disposed next to or adjacent a second element may be directly in contact with the second element or it may include one or more intervening elements. In addition, in the instant description, figures and/or elements may be referred to in the alternative. In such a case, for example where the description refers to Figs. X/Y showing an element A/B, what is meant is that Fig. X shows element A and Fig. Y shows element B. In addition, a "layer" as used herein may refer to a layer made of a single material, a layer made of a mixture of different components, a layer made of various sub-layers, each sub-layer also having the same definition of layer as set forth above.

Figure 2A:
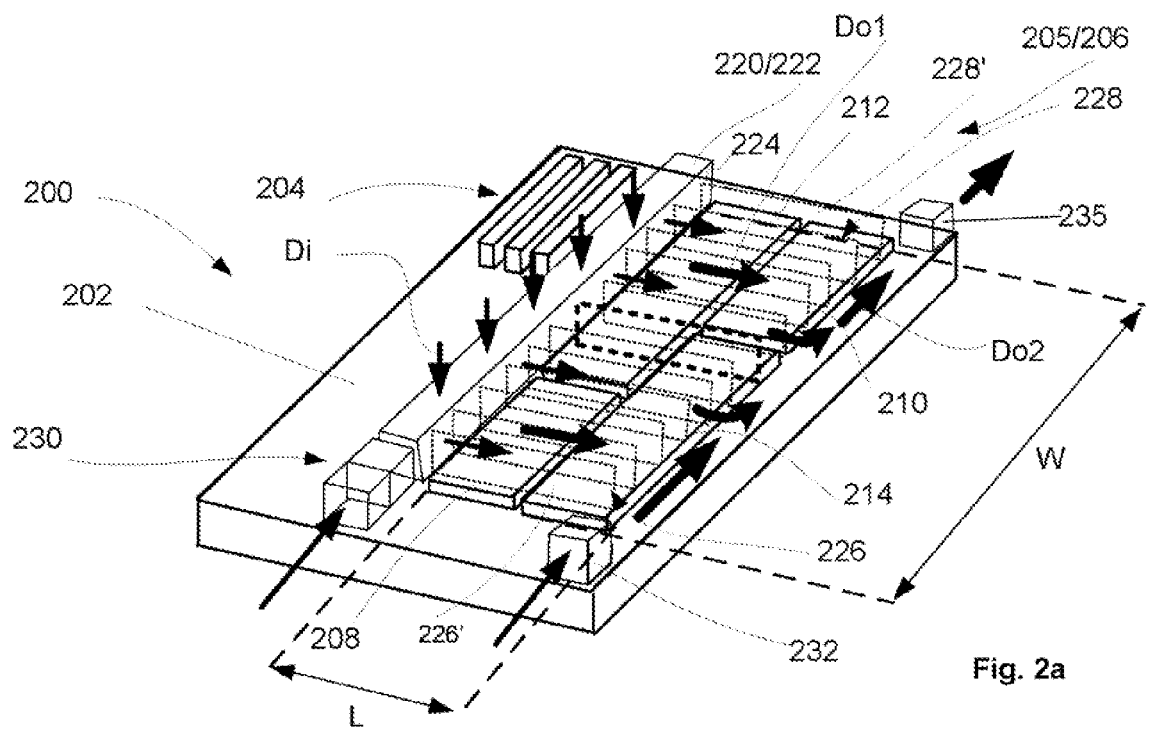
FIG. 2a is a perspective view of a portion of a circuit board including a multi-core server CPU heat generating arrangement similar to the heat generating arrangement of FIG. 1, being cooled by a cooling system according to a first embodiment.
Figure 2B:
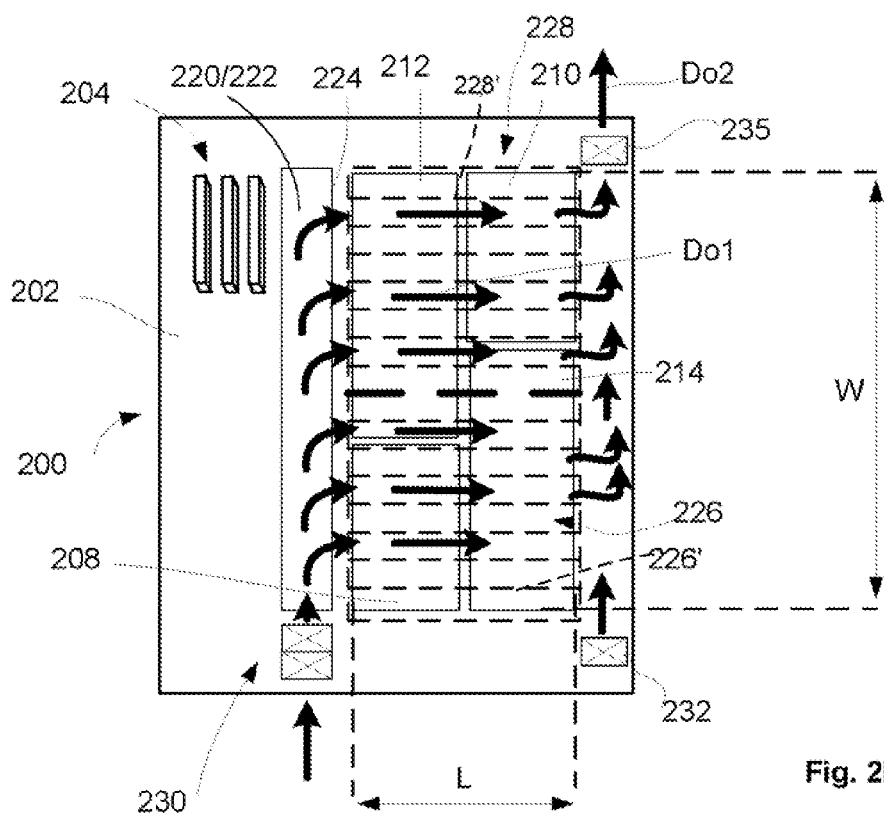
Figure 3:
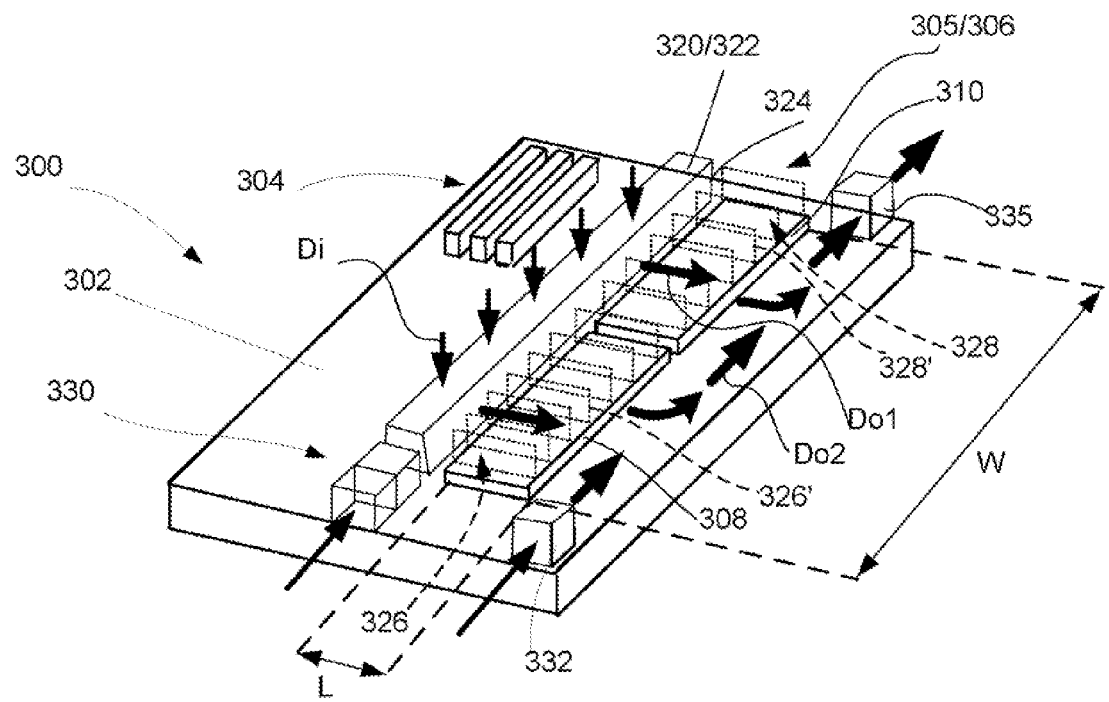
FIG. 3 is a perspective view of a portion of a circuit board including a multi-core server CPU heat generating arrangement similar to the heat generating arrangement of FIG. 1, being cooled by a cooling system according to a second embodiment.

Aspects of this and other embodiments will be discussed herein with respect to FIGS. 2a, 2b, 3 and 4 below. The figures, however, should not be taken to be limiting, as it is intended for the purpose of explanation and understanding. FIGS. 2a and 2b are differing views of a portion of a circuit board according to a first embodiment, while FIG. 3 is a view similar to FIG. 2a showing a portion of a circuit board according to a second embodiment.

Referring to FIGS. 2a, 2b/3, a portion of a circuit board 200/300 according to embodiments may include a board substrate 202/302 onto which a heat generating arrangement 206/306 may be disposed. In the embodiment of FIGS. 2a and 2b, the heat generating arrangement 206 includes a multi-core server CPU region 205 including a first CPU 208, a second CPU 210, and memory modules in the form of a first DRAM 212 and a second DRAM 214. In the shown embodiment of FIGS. 2a and 2b, the first CPU 208 and the first DRAM 112 are disposed at a first half of the multi-core server CPU region 205, the first half occupying an entire width dimension W of the multi-core server CPU region 205, and half of the length dimension L of the same. Referring still to FIGS. 2a and 2b, the second CPU 210 and the second DRAM 114 are disposed at a second half of the multi-core server CPU region 205, the second half, similar to the first half, occupying an entire width dimension W of the multi-core server CPU region 205, and half of the length dimension L of the same. The heat generating arrangement of FIG. 3, on the other hand, has a multi-core server CPU region 305 including a first CPU 308 having a first DRAM integrated therein, and a second CPU 310 having second DRAM integrated therein, the first and second CPU's 308 and 310 being disposed in-line with respect to one another. Although the shown embodiments of FIGS. 2a and 2b on the one hand, and of FIG. 3 on the other hand, show heat generating arrangements including multi-core server CPU regions, embodiments are not so limited, and include within their scope any heat generating arrangement adapted to be placed on a circuit board, such as, for example, any integrated circuit, chipsets, graphics cards, and hard drive components, to name just a few.

Referring still to FIGS. 2a, 2b/3, embodiments further include a blower 220/320 disposed on the board substrate 202/302. As shown, the blower 220/320 may have an inlet 222/322 adapted to take in coolant in a inlet direction Di, and an outlet 224/324 adapted to blow out coolant in a first outlet direction Do1 that extends at an angle with respect to the inlet direction. The direction of coolant flow in the figures is shown by way of bold-faced arrows. According to the instant description, A is disposed at "at an angle" with respect to B where the angle between A and B is anywhere above 0 degrees and below 360 degrees. In the context of the instant description, the angle is anywhere between 45 degrees and 135 degrees, and preferably about 90 degrees. In the shown embodiment of FIGS. 2a, 2b/3, blower 220/320 is a tangential blower, blowing out air at about 90 degrees with respect to its inlet direction. The blower according to embodiments may include any well known blower, such as, for example, a tangential blower, or a number of centrifugal blowers placed in line with respect to one another, which takes in coolant, such as air, at an inlet thereof oriented in a inlet direction, and which expels it through an outlet thereof in a direction disposed at an angle with respect to the inlet direction. Where the blower includes a tangential blower, otherwise known as a cross flow fan, it will give off a substantially even airflow along the entire width of the fan. In addition, by "coolant," what is meant in the context of embodiments is any fluid, such as air or any other suitable gas, that is adapted to cool a component on a circuit board by way of heat exchange therewith.

Referring still to FIGS. 2a, 2b/3, according to embodiments, the heat generating arrangement 206/306 may be disposed on the board substrate 202/302 such that the blower 220/320 is adapted to blow out coolant in the first outlet direction Do1 to cool the heat generating arrangement 206/306. In the shown embodiments of FIGS. 2a, 2b/3, the heat generating arrangement 206/306 is disposed directly at the outlet 224/324 of the blower 220/320. As shown in FIGS. 2a, 2b/3, according to some embodiments, a heat sink, such as heat sinks 226/326 and 228/328 may be disposed on the heat generating arrangement. Heat sinks 226/326 and 228/328 are disposed adjacent to one another on the heat generating arrangement 206/306 so as to take up an entire upper surface area of the heat generating arrangement for optimal heat exchange. Heat sinks 226/326 and 228/328 include fins 226'/326' and 228'/328' thereon as shown in broken lines in the figures, the border between heat sinks 226/326 and 228/328 being shown in the figures by way of broken lines in bold face. The fins 226'/326' and 228'/328' are oriented to direct coolant emerging from the outlet of the blower over the heat generating arrangement and out from an outlet of the heat sinks, and create heat exchange passages for the coolant emerging from the blower 220/320, directing the coolant over the heat generating arrangement 206/306. In the shown embodiments, the fins direct the coolant in the direction of the first outlet direction Do1, and thus take in the coolant emerging from the blower 220/320, and, without changing the direction of the coolant, direct the same across the heat generating arrangement 206/306 to cool the same. Preferably, where, as in the case of FIGS. 2a, 2b/3, the heat generating arrangement 206/306 has a width dimension W which is larger than its length dimension L, the first outlet dimension Do1 is substantially parallel to the length dimension L, and, in addition, the fins 226'/326' and 228'/328' are substantially parallel to the length dimension L, in this way ensuring a shorter and thus more effective heat exchange distance within the totality of the heat sinks on the heat generating arrangement 206/306.

Referring still to FIGS. 2a, 2b/3, optionally, some embodiments may provide a fan, such as an axial fan 230/330 disposed on the board substrate 202/302, and adapted to blow coolant to the inlet of the blower 220/320. The axial fan 230/330 accelerates coolant intake into the blower 220/320, and in this way expedites heat exchange with the heat generating arrangement 206/306 by increase the coolant flow rate in the heat sinks 226/326 and 228/328. The axial fan 230/330 may include one or more axial fans disposed in series. In addition, to accelerate coolant exhaust from the heat sinks 226/326 and 228/328, an axial fan 232/332 may be disposed on the board substrate 202/302 upstream of the heat sink exhaust location to blow coolant emerging from the outlet of the heat sinks 226/326 and 228/328 in a second outlet direction Do2 that extends at an angle with respect to the first outlet direction Do1. In the shown embodiments of FIGS. 2a, 2b/3, the axial fan 232/332 redirects the coolant emerging from the heat sinks in a second outlet direction Do2 that is about 90 degrees with respect to the first outlet direction Do1, in this way ensuring coolant exhaust from the area of the heat generating arrangement. In addition to axial fan 232/332, or instead of axial fan 232/332, to accelerate coolant exhaust from the heat sinks 226/326 and 228/328, an axial fan 235/335 may be disposed on the board substrate 202/302 downstream of the heat sink exhaust location to blow coolant emerging from the outlet of the heat sinks 226/326 and 228/328 in the second outlet direction Do2.

Advantageously, embodiments provide a cooling arrangement including a blower that changes the direction of coolant flow on a circuit board, in this way making possible the accommodation of heat generating arrangements disposed on the circuit board, and especially of heat generating arrangements including multi-core server CPU regions, and in particular of CPU cores having memory modules integrated therein. One embodiment advantageously provides a combination between a tangential blower and rotary axial fans, which cooling arrangement than allows the accommodation of larger heat sinks with fins oriented to shorten the heat exchange paths on a board heat generating arrangement. The provision of heat sinks having fins oriented to shorten the heat exchange paths on a heat generating arrangement advantageously provide significant cooling improvements as compared with the prior art. In addition, advantageously, embodiments allow the use of heat sinks that avoid large pressure drops across their fins, in this way improving coolant flow and thus heat exchange with the coolant. Moreover, advantageously, embodiments allow the use of the space already available on circuit boards in an efficient manner by increasing the heat sink width. Embodiments avoid the need for long, narrow heat sinks which are highly ineffective from thermal and flow impedance standpoints. According to an embodiment, the use of a tangential fan in combination with axial fans effectively eliminates pre-heat from upstream heat sinks, and also increases the width of the heat sinks, which provides a configuration that is thermally much more efficient than that of the prior art.

Figure 4:
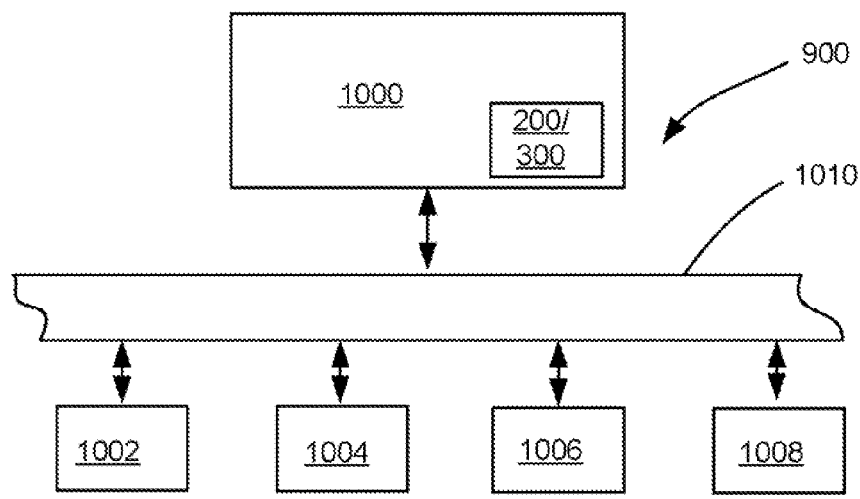
FIG. 4 is a schematic view of an embodiment of a system incorporating a circuit board a portion is which is shown in FIGS. 2a and 2b or in FIG. 3.

Referring to FIG. 4, there is illustrated one of many possible systems 900 in which embodiments of the present invention may be used. In one embodiment, the electronic assembly 1000 may include a circuit board, such as circuit boards 200 and 300, portions of which are shown respectively in FIGS. 2a-2b and 3. Assembly 1000 may further include a microprocessor. In an alternate embodiment, the electronic assembly 1000 may include an application specific IC (ASIC). Integrated circuits found in chipsets (e.g., graphics, sound, and control chipsets) may also be packaged in accordance with embodiments of this invention.

For the embodiment depicted by FIG. 4, the system 900 may also include a main memory 1002, a graphics processor 1004, a mass storage device 1006, and/or an input/output module 1008 coupled to each other by way of a bus 1010, as shown. Examples of the memory 1002 include but are not limited to static random access memory (SRAM) and dynamic random access memory (DRAM). Examples of the mass storage device 1006 include but are not limited to a hard disk drive, a compact disk drive (CD), a digital versatile disk drive (DVD), and so forth. Examples of the input/output module 1008 include but are not limited to a keyboard, cursor control arrangements, a display, a network interface, and so forth. Examples of the bus 1010 include but are not limited to a peripheral control interface (PCI) bus, and Industry Standard Architecture (ISA) bus, and so forth. In various embodiments, the system 90 may be a wireless mobile phone, a personal digital assistant, a pocket PC, a tablet PC, a notebook PC, a desktop computer, a set-top box, a media-center PC, a DVD player, and a server.

The various embodiments described above have been presented by way of example and not by way of limitation. Having thus described in detail embodiments of the present invention, it is understood that the invention defined by the appended claims is not to be limited by particular details set forth in the above description, as many variations thereof are possible without departing from the spirit or scope thereof.

What is claimed is:

1. A circuit board including:
   a board substrate;
   blower disposed on the board substrate, the blower having an inlet adapted to take in coolant in a inlet direction, and an outlet adapted to blow out coolant in a first outlet direction extending at an angle with respect to the inlet direction;
   an axial fan disposed on the board substrate adapted to blow coolant to the blower; and
   a heat-generating arrangement disposed on the board substrate such that the blower is adapted to blow out coolant in the first outlet direction over the heat generating arrangement to cool the heat generating arrangement.

2. The circuit board of claim 1, further comprising a heat sink disposed on the heat-generating arrangement and including fins oriented to direct coolant emerging from the outlet of the blower over the heat generating arrangement and out from an outlet of the heat sink.

3. The circuit board of claim 2, wherein the heat sink includes plurality of heat sinks.

4. The circuit board of claim 2, wherein the heat generating arrangement has a length dimension L and a width dimension W, W being larger than L, and wherein the first outlet direction is substantially parallel to the length dimension L.

5. The circuit board of claim 1, wherein the blower is a tangential blower, and wherein the first outlet direction extends at an angle of about 90 degrees with respect to the inlet direction.

6. The circuit board of claim 2, further including an axial fan disposed on the board substrate to blow coolant emerging from the outlet of the heat sink in a second outlet direction extending at an angle with respect to the first outlet direction.

7. The circuit board of claim 6, wherein the second outlet direction extends at an angle of about 90 degrees with respect to the first outlet direction.

8. The circuit board of claim 1, wherein the heat generating arrangement includes a CPU.

9. The circuit board of claim 8, wherein the heat generating arrangement includes a plurality of in-line CPU's.

10. The circuit board of claim 8, wherein the heat generating arrangement includes a CPU and a DRAM integrated into the CPU.

11. A system including:
    an electronic assembly comprising:
      a circuit board including:
        a board substrate;
        a blower disposed on the board substrate, the blower having an inlet adapted to take in coolant in a inlet direction, and an outlet adapted to blow out coolant in a first outlet direction extending at an angle with respect to the inlet direction;
      an axial fan disposed on the board substrate adapted to blow coolant to the blower;
      a heat-generating arrangement disposed on the board substrate such that the blower is adapted to blow out coolant in the fist outlet direction over the heat generating arrangement to cool the heat generating arrangement; and
    a main memory coupled to the electronic assembly.

12. The circuit board of claim 11, further comprising a heat sink disposed on the heat generating arrangement and including fins oriented to direct coolant emerging from the outlet of the blower over the heat generation arrangement and out from an outlet of the heat sink in the first outlet direction.

13. The circuit board of claim 12, wherein the blower is an tangential blower, and wherein the first outlet direction extends at an angle of about 90 degrees with respect to the inlet direction.

* * * * *